United States Patent
Kubena et al.

(10) Patent No.: US 8,933,759 B1
(45) Date of Patent: Jan. 13, 2015

(54) DYNAMIC DAMPING IN A QUARTZ OSCILLATOR

(71) Applicant: HRL Laboratories, LLC, Malibu, CA (US)

(72) Inventors: Randy L. Kubena, Oak Park, CA (US); Deborah J. Kirby, Calabasas, CA (US)

(73) Assignee: HRL Laboratories, LLC, Malibu, CA (US)

( * ) Notice: Subject to any disclaimer, the term of this patent is extended or adjusted under 35 U.S.C. 154(b) by 15 days.

(21) Appl. No.: 13/931,321

(22) Filed: Jun. 28, 2013

(51) Int. Cl.
*H03B 5/32* (2006.01)
*H03B 1/04* (2006.01)

(52) U.S. Cl.
CPC .................................... *H03B 1/04* (2013.01)
USPC ........................................ 331/163; 331/153

(58) Field of Classification Search
USPC ................................................. 331/163, 158
See application file for complete search history.

(56) References Cited

U.S. PATENT DOCUMENTS

| | | | |
|---|---|---|---|
| 3,012,204 A | 12/1961 | Dransfeld | |
| 3,401,354 A | 9/1968 | Seidel | |
| 3,816,753 A | 6/1974 | Kino | |
| 4,145,929 A | 3/1979 | Aske | |
| 4,320,320 A | 3/1982 | Momosaki | |
| 4,419,600 A | 12/1983 | Sinha | |
| 4,544,897 A | 10/1985 | Ishikawa | |
| 4,872,765 A | 10/1989 | Schodowski | |
| 5,652,556 A | 7/1997 | Flory | |
| 5,701,049 A | 12/1997 | Kanayama et al. | |
| 5,752,410 A | 5/1998 | Bernstein | |
| 5,912,594 A | 6/1999 | Burkhard | |
| 5,939,815 A | 8/1999 | Kosinski | |
| 5,966,053 A | 10/1999 | Durig | |
| 7,237,315 B2 | 7/2007 | Chang et al. | |
| 7,459,099 B2 | 12/2008 | Kubena | |
| 7,633,213 B2 | 12/2009 | Takayama et al. | |
| 8,305,154 B1 | 11/2012 | Kubena | |
| 2001/0002807 A1 | 6/2001 | Yoshida et al. | |
| 2002/0050882 A1 | 5/2002 | Hyman et al. | |
| 2006/0162453 A1 | 7/2006 | Mikado et al. | |
| 2007/0176701 A1 | 8/2007 | Nakamura | |
| 2007/0194665 A1 | 8/2007 | Takei et al. | |
| 2008/0067892 A1 | 3/2008 | Chiba et al. | |
| 2010/0093125 A1 | 4/2010 | Quevy et al. | |
| 2011/0068660 A1 * | 3/2011 | Naito et al. | 310/367 |
| 2011/0260802 A1 | 10/2011 | Villanueva | |

OTHER PUBLICATIONS

From U.S. Appl. No. 12/835,610, Application and Office Actions, including but not limited to the Office Actions mailed on Mar. 6, 2012, Jun. 25, 2012, Dec. 13, 2012, and May 30, 2013.
From U.S. Appl. No. 12/954,475 (now U.S. Patent No. 8,305,154), Application and Office Actions, including but not limited to the Office Actions mailed on Mar. 6, 2012 and Jun. 29, 2012.

* cited by examiner

*Primary Examiner* — Joseph Chang
(74) *Attorney, Agent, or Firm* — Ladas & Parry

(57) ABSTRACT

A shear-mode quartz resonator designed to mechanically oscillate at a predetermined frequency and electronic circuits for inhibiting oscillation of the shear-mode quartz resonator in response to externally applied mechanical forces which otherwise induce mechanical vibration of the shear-mode quartz resonator at frequencies significantly less than the predetermined frequency. The shear-mode quartz resonator includes a cantilevered quartz beam having relatively large metallic electrodes attached on opposite sides thereof, the relatively large metallic electrodes, in use, being coupled to an external oscillator circuit. The beam also has relatively smaller sense and rebalance electrodes attached on the same opposite sides of said quartz beam as said relatively large metallic electrodes. The relatively smaller sense and rebalance electrodes being coupled, in use, with said electronic circuits for inhibiting oscillation of the shear-mode quartz resonator in response to externally applied mechanical forces.

23 Claims, 4 Drawing Sheets

DYNAMIC DAMPING IN A QUARTZ OSCILLATOR

STATEMENT REGARDING FEDERALLY SPONSORED RESEARCH OR DEVELOPMENT

This invention was made under US Government Contact No. HR001-10-C-0109 and therefor the US Government may have certain rights in this invention.

CROSS REFERENCE TO RELATED APPLICATIONS

This application is related to U.S. patent application Ser. No. 12/835,610 filed Jul. 13, 2012 and entitled "Piezoelectric Resonator Configured For Parametric Amplification" the disclosure of which is hereby incorporated by reference.

TECHNICAL FIELD

The present technology relates to the field of resonator devices.

BACKGROUND

Electronic systems have become ubiquitous in many modern societies, wherein these systems may be used to perform various tasks electronically, such as to increase the ease and efficiency with which certain tasks may be carried out. Oftentimes, it is useful in such electronic systems that an electrical signal be created with a particular frequency, such as to provide a stable clock signal for digital integrated circuits. Resonator devices are frequently used in oscillators to generate the aforementioned particular frequency.

Prior art resonator devices tend to be sensitive to external vibrations which affect the stability of the particular frequency which they are intended to generate when connected within an oscillator. Therefore there is a need to reduce the sensitivity of resonator devices to external vibration. In the prior art this problem has been addressed by utilizing a separate inertial sensor to detect such external vibrations and to attempt to correct changes in the oscillators frequency by pulling the frequency within the sustaining circuit of the oscillator. However, this increases the overall size of the system (since there is a separate inertial sensor added to the mix) and it does not properly correct for non-linear mechanical behavior within the quartz of the oscillator resonator for large vibrations. Prior art devices have used separate inertial sensors for detecting vibrations of the quartz resonator and correcting the changes in the oscillator frequency by pulling the frequency of the oscillator electrically within the sustaining circuit of the oscillator. However, this increases the overall size of the system and does no correct for non-linear mechanical behavior within the quartz for large vibrations.

What is needed is a more accurate way to inhibit mechanical vibrations otherwise induced in quartz resonators due to environmental shock while continuing to allow the quartz resonators to vibrate at their normal frequencies.

BRIEF DESCRIPTION OF THE INVENTION

In this patent we describe a method and apparatus to use the quartz resonator as both an oscillator resonator and as it own accelerometer for detecting mechanically induced vibrations and then to force rebalance the quartz resonator using additional force rebalance electrodes disposed on the quartz resonator and using electrostatic forces therewith. This inhibits or reduces externally induce vibration strains in the quartz resonator which would otherwise cause undesirable variations in the frequency of oscillation of the quartz resonator. This technique also results in a better method for reducing vibrationally induced increases in phase noise.

A mechanical resonator designed to mechanically oscillate at a predetermined frequency and electronic circuits for inhibiting oscillation of the resonator in response to externally applied mechanical forces which otherwise would induce mechanical vibration of the resonator at frequencies significantly less than the predetermined frequency. The resonator includes a cantilevered beam, preferably made of quartz, having relatively large metallic electrodes attached on opposite sides thereof, the relatively large metallic electrodes, in use, being coupled to an external oscillator circuit. The beam also has relatively smaller sense and rebalance electrodes attached on the same opposite sides of said beam as said relatively large metallic electrodes. The relatively smaller sense and rebalance electrodes being coupled, in use, with said electronic circuits for inhibiting oscillation of the shear-mode quartz resonator in response to externally applied mechanical forces.

The described technology also relates to a method of dynamically damping a quartz resonator comprising the steps of: disposing sense and rebalance electrodes on opposite side of a quartz beam of said quartz resonator; disposing opposing sense and rebalance electrodes on structural members supporting and at least partially surrounding said quartz beam, opposing sense and rebalance electrodes being disposed in a confronting relationships with corresponding sense and rebalance electrodes on said quartz beam; using a first electronic circuit coupled to said sense electrodes on said quartz beam and on said structural members to sense movement of said beam in response to an externally applied shock; and using a second electronic circuit couple to said first electronic circuit and to said rebalances electrodes on said quartz beam and on said structural members to apply a counter-acting electrostatic force to said quartz beam to counter-act significant movement of said quartz beam in response to said externally applied shock.

DETAILED DESCRIPTION

Figure 1:
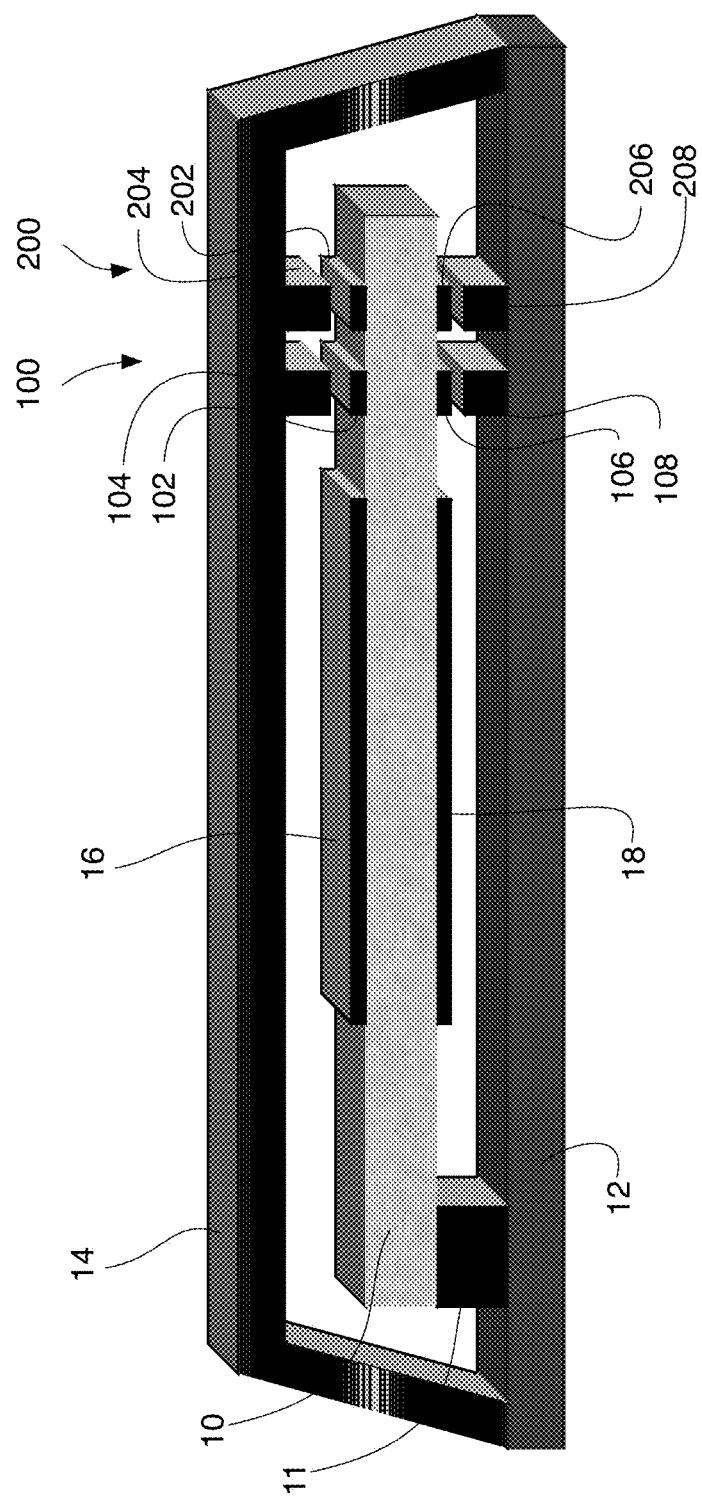
FIG. 1 is a three dimension view of a resonator with force and rebalance electrodes on both the quartz beam and on neighboring structure.

It is known through experimentation and modeling that the vibrational sensitivity of quartz shear-mode resonators is largest in the out-of-plane direction (or Y-axis direction of the typical cuts of shear-mode quartz resonators). Typical out-of-plane of vertical sensitivities are $\sim 10^{-9}$ fractional deviation per g while the in-plane sensitivities are several orders of magnitude smaller. Thus, it is highly desirable to reduce the out-of-plane sensitivity using the capacitive rebalance techniques described herein where inertial forces can be compensated for at the resonator itself if small gaps are available for capacitive sense and electrostatic force rebalance, similar to the operation of MEMS-based accelerometers. However, the resonators need to be thin (10 μm) so that this rebalance technique is ideally suited for UHF shear mode devices.

Capacitive sense and force rebalance electrodes are added to a shear-mode quartz resonator and an electronic loop is used to (i) sense movement of the shear-mode quartz resonator and (ii) supply voltages to the force rebalance electrodes to counteract against such movement. By adding additional electrodes on the quartz surface of the hear-mode quartz resonator, the substrate, and a capping wafer, differential capacitive sense and force rebalance can be achieved.

The shear-mode quartz resonator is preferably made using an integrated quartz MEMS process taught by U.S. Pat. No. 7,237,315 which allows the gap spacings between the sense and force rebalance electrodes electrodes to be reduced to the range of 2-10 microns. This allows large electrostatic forces to be produced with small voltages and large capacitive sensitivity to the movement of the quartz resonator.

Since the frequency stability of an oscillator is dependent on the frequency stability of the resonator, any strain in the resonator due to vibration can introduce unwanted frequency instabilities. For quartz shear-mode resonators, the largest vibration sensitivity is known to occur for vibrations perpendicular to the shearing plane. The concept disclosed herein is to use electrostatic forces rebalance to prevent the quartz resonator from moving in its vertical direction normal to the shearing plane and thus reduce a high level of vibration-induced frequency instability. Since the shear-mode resonances are generally much higher in frequency (10 MHz-1 GHz) than induced mechanical vibrations (10 Hz-2 KHz), the frequencies of the sustaining circuit for the oscillator (e.g., Pierce, Colpitts, Clapp, etc.) are greatly different from the force rebalance loop and the electrostatic rebalance forces do not interfere with the much higher frequencies at which the shear-mode quartz resonator is intended to oscillate.

The disclosed technique ideally works best for shear-mode resonators with fundamental mode resonances in the UHF range. In this case, the quartz thickness of the shear-mode quartz resonator is below about 5 microns and can produce displacements in the nm range for an induced one g vibration. This amount of displacement can easily be detected with capacitive sense electronics capable of attofarad (aF) detection. Calculations show that for typical dimensions of the capacitive sense electrodes (100s of square microns), gap spacings of roughly 5 microns, and nm range motion, capacitive sense electronics can be used to detect mg level vibration for force rebalance. Since typical vibration sensitivities for inherent quartz resonators is 10-9 fractional frequency deviation per g, this allows the frequency stability to be improved to <10-11 even in the presence of large vibrations greater than one g in the vertical direction. Since the vertical vibration sensitivity is about two orders of magnitude larger than in the in-plane directions, the overall vibration sensitivity can be greatly reduced.

The capacitive sense and force rebalance electrodes can be arranged in various configurations on the quartz plate and on the substrate and capping wafers. In one configuration, shown in FIG. 1, the groups of capacitive sense and force rebalance electrodes 100, 200 are placed at the end of the cantilevered quartz beam 10 of the depicted shear-mode resonator and are also placed in opposition to the electrode on the beam 10 on a cap 14 and a substrate 12. The cantilevered quartz beam 10 is supported at one end on a pedestal 11 relative to the substrate 12. The cap 14 surrounds the cantilevered quartz beam 10 and is also supported by the substrate 12.

Conventional top and bottom electrodes 16, 18 are used with an external oscillator circuit (e.g., the Pierce, Colpitts, Clapp, etc. oscillators noted above) to generate high frequency oscillations (for example in the UHF range). Since such external oscillator circuits are well known they are not shown herein. Moreover this invention is concerned with the groups of sense and force rebalance electrodes 100, 200 rather than the conventional top and bottom electrodes 16, 18.

The group of sense electrodes 100 comprises four electrodes, two of which (electrodes 102 and 106) are disposed on beam 10. Opposing the top most sense electrode 102 on the beam is an electrode 104 disposed on cap 14. Opposing the bottom most sense electrode 106 on the beam is an electrode 108 disposed on substrate 12.

Electrodes 102 and 104 are spaced apart by a distance of preferably of about 5 microns and form the plates of a first variable capacitor $C_{s1}$. Electrodes 106 and 108 are also spaced apart by the same distance (preferably by about 5 microns) and form the plates of a second variable capacitor $C_{s2}$.

The group of rebalance electrodes 200 comprises four electrodes in this embodiment, two of which (electrodes 202 and 206) are disposed on beam 10. Opposing the top most rebalance electrode 202 on the beam is a rebalance electrode 204 disposed on cap 14. Opposing the bottom most rebalance electrode 206 on the beam is a rebalance electrode 208 disposed on substrate 12.

Rebalance electrodes 202 and 204 are spaced apart by a distance of preferably of about 5 microns or less and rebalance electrodes 206 and 208 are similarly spaced apart by a distance of preferably of about 5 microns or less. Additional sets of force rebalance electrodes are be utilized if desired.

In other embodiments, the force rebalance electrodes can surround (or nearly surround) the shear-mode electrodes in a picture frame to reduce mechanical motion very near the shear-mode active region at electrodes 16, 18. See FIG. 2 which is a bottom view of the quartz bar with electrodes 18, 106 and 206 shown. Note how sense electrode 106 surrounds electrode 18 and the rebalance electrode 206 also surrounds electrode 18. Similar picture frame electrodes would be disposed on the top side of beam 10 as well as on the substrate and on cap 14 in opposition to the corresponding electrodes on beam 10.

Figure 2:
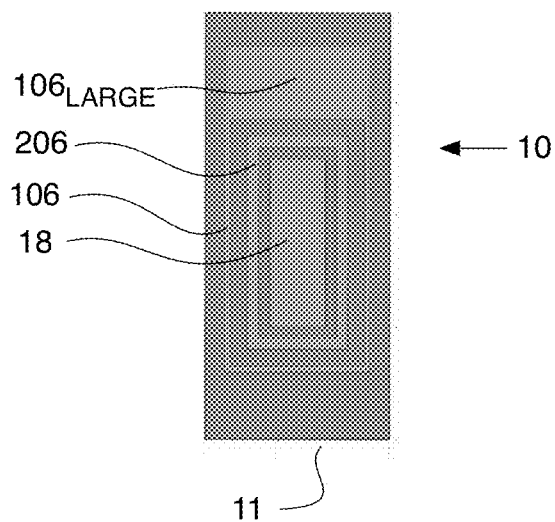
FIG. 2 is a bottom view of the quartz bar with sense and rebalance electrodes taking a picture frame configuration.

In FIG. 2 the sense electrode is larger (see $106_{LARGE}$) at the distal end (remote from pedestal 11) of the cantilevered quartz resonator 10 to maximize its detection sensitivity while the force rebalance electrode preferably surrounds electrode 18 to prevent or deduce bending under high Q loads.

The picture frame shaped sense 106 and rebalance 206 electrodes of FIG. 2 may include openings in their picture frame shapes to allow wiring from the inner electrodes to more conveniently reach substrate 12 and thence the electronic circuits to which the resonator is connected in use. Alternatively, multi-level wiring techniques could be used to allow wiring from the inner electrodes to more conveniently reach substrate 12 and thence the electronic circuits to which the resonator is connected in use.

Figure 3:
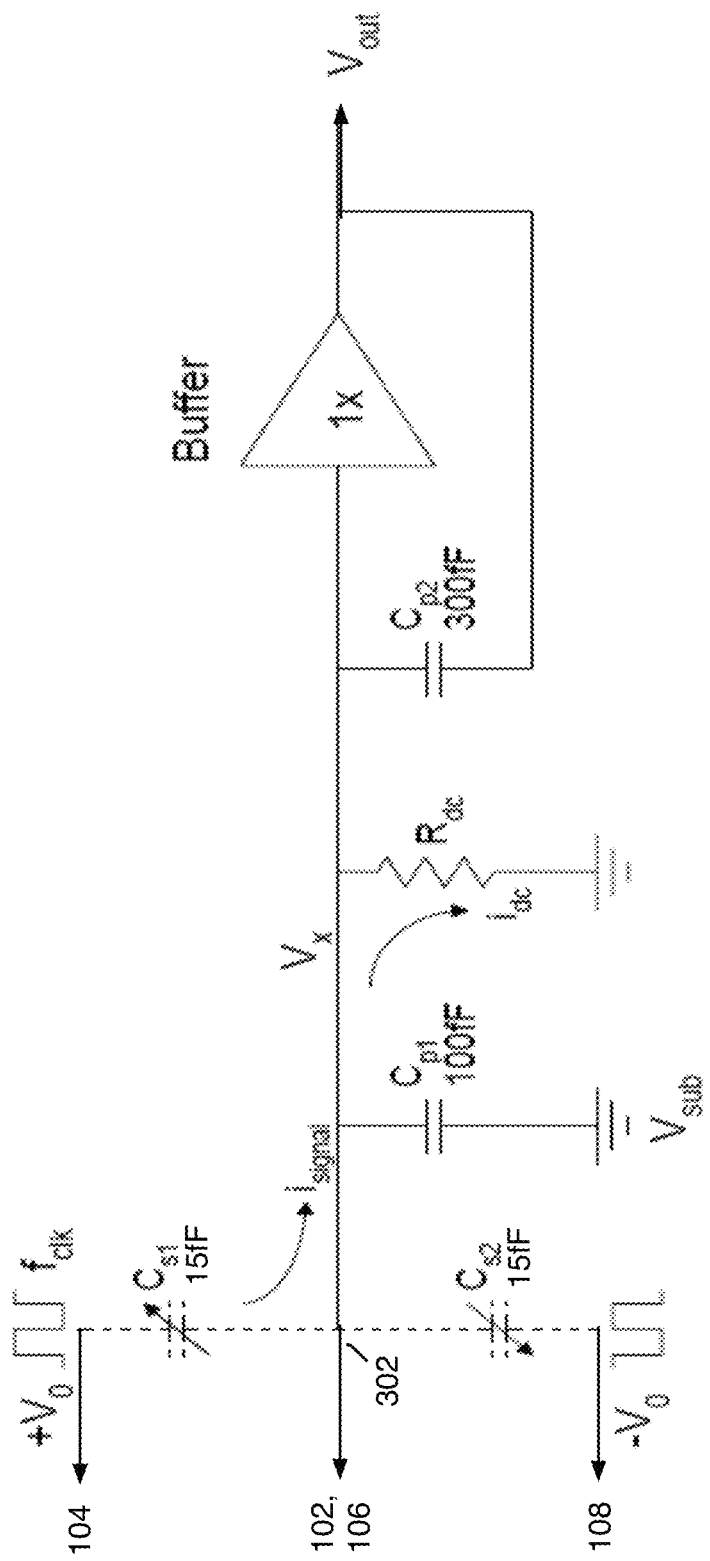
FIG. 3 is a schematic diagram of a preferred embodiment of the sense electronics coupled to the sense electrodes of the resonator.

A preferred embodiment of the sense electronics is shown in FIG. 3. In this embodiment, single-sided square wave clock signals ($f_{clk}$) are applied to sense electrodes 104 and 108. Note that the two square wave signals are 180° out of phase with respect to each other and that the square wave oscillator frequency is about 1 GHz in this embodiment. The single-sided square wave clock signals ($f_{clk}$) should ideally be higher in frequency than the oscillator clock frequency controlled by resonator 10 to help prevent noise from coupling into the electronics. In one embodiment might well include a multiplier so that $f_{clk}$ is then some multiple of (i.e., a higher frequency than) the oscillator clock frequency controlled by resonator 10.

The variable capacitors formed by the upper opposing electrode pair 102, 104 and the lower opposing electrode pair 106, 108 are shown as $C_{s1}$ and $C_{s2}$, respectively, each having a nominal value of 15fF in this embodiment. Capacitors $C_{s1}$ and $C_{s2}$ are shown in phantom lines since they are inherent in the design of the resonator as opposed to being added discreet electronic components. The arrows through $C_{s1}$ and $C_{s2}$ are shown in opposite directions to reflect that fact that movement of beam 10 causes one capacitor to increase in value while the other capacitor decreases in value.

The sense electronics of FIG. 3 has a limited bandwidth so that it does not respond to the normal high frequency vibrations of beam 10 yet it does response to the relatively low frequency vibrations of beam 10 induced externally. Preferably the sense electronics of FIG. 3 has bandwidth of about 1 KHz. The Buffer should preferably be a low-noise op amp such as a Texas Instruments operational amplifier model LMH6624.

In FIG. 3, $i_{signal}$ is the AC differential current developed across the sense capacitors (sense electrodes 102 & 104; 106 & 108). At no applied acceleration, this signal is zero. For motion of the beam upward, this signal is positive in this embodiment and for motion of the beam downward, this signal is negative in this embodiment. It is the filtered current at a low pass bandwidth (of about 1 KHz) which floods through $R_{dc}$ to produce a filtered voltage $V_x$ that is buffered and becomes a control signal $V_{out}$. $V_x$ is either positive or negative depending on whether the quartz beam was moved upwardly or downwardly, respectively, in response to a applied acceleration due to an external shock, for example.

The sense electronics of FIG. 3 outputs the control signal or voltage $V_{out}$ which if other than 0 volts is trying to counteract externally induced vibrations. The control voltage $V_{out}$ is applied to the rebalance circuit of FIG. 4. The control voltage $V_{out}$ is positive for a positive vertical displacement of the cantilevered beam 10. This is based on the clock input polarities on the differential capacitive sense electrodes 104, 108 and the summing junction 302 as shown in FIG. 3. Control signal $V_o$ is then applied to a set of inverting integrators 402, 404 for applying the force rebalance voltages to rebalance electrodes 204, 208 in cap 14 and on substrate 12. The force rebalance counter electrodes 202, 206 on the quartz beam 10 can be held at zero potential. Using differential capacitive sensing and force rebalance, the quartz cantilevered beam can be maintained in its undeflected position (due to external acceleration inputs) at all times which prevents changes in its nominal frequency of vibration otherwise due to externally induced vibrations (from such external acceleration inputs).

Figure 4:
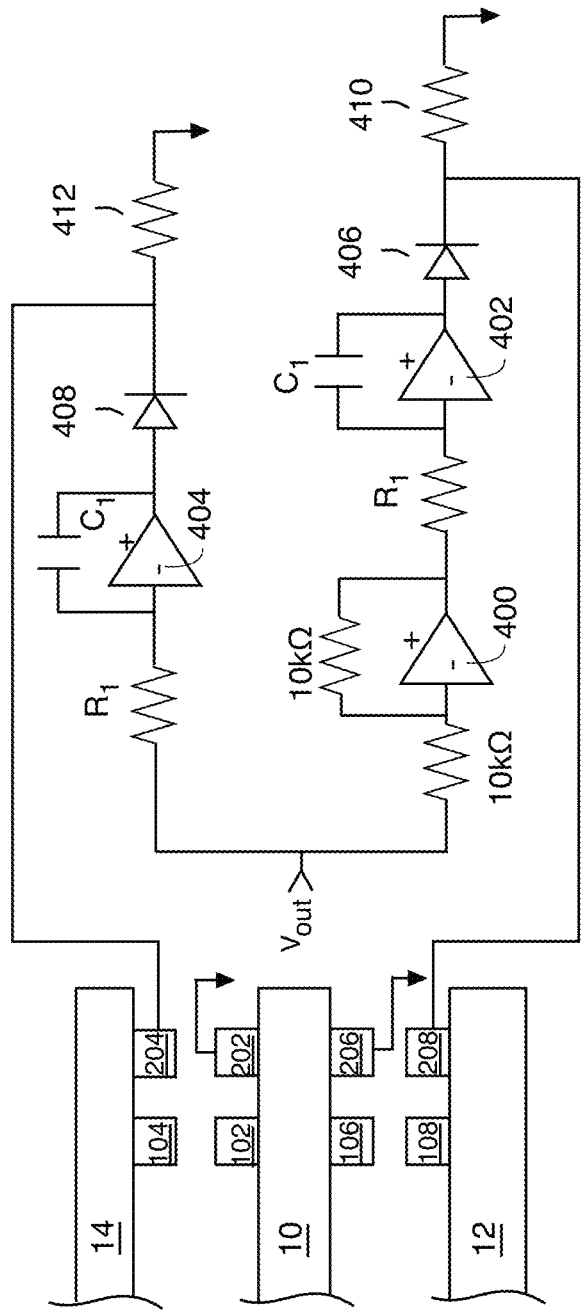
FIG. 4 is a schematic diagram of a preferred embodiment of the rebalance electronics coupled to the sense electronics and to the rebalance electrodes of the resonator.

The signal from the capacitance sensing buffer output $V_{out}$ is applied to both a standard inverting integrator 404 and a unity gain inverter 400 followed by an inverter integrator 402 in the rebalance circuit of FIG. 4. The time constants of inverting integrators 402, 404 is preferably set to be about 1 msec. The outputs of the inverting integrators 402, 404 are passed through diodes 406, 408 and then to the appropriate force rebalance electrode 204, 208 each with a parallel resistance load 410, 412. The inverting integrators 402, 404 allow the voltage $V_{out}$ from the sensing buffer output to be integrated and adjusted to null and hold the position of the cantilever beam 10 near its zero deflection point under applied external vibration (accelerations). The diodes 406, 408 are used to block the signal to the opposing force rebalance electrode so that the electrostatic force is always applied in the needed direction to counter the external applied acceleration. The time constants of the integrators (R1×C1) are made equal and should be ideally about 50 μsec to allow compensation of vibration signals up to frequencies of about 1 KHz. This is only one embodiment of the force rebalance loop, and a person skilled in the art should be able to envision other embodiments. Functionally the circuit of FIG. 4 provides negative feedback to damp out the mechanical oscillations which might otherwise be induce in the device due to an externally applied shock or vibration. Numerous feedback circuits are possible in addition to the integral feedback of FIG. 4. Some feedback circuits may incorporate proportional as well as integral feedback and various filters to ensure stability and performance. These circuits should be well known to those of skill in the art. These circuits could involve using microprocessor based systems to integrate and switch the appropriate signals to the force rebalance electrodes or by applying DC biases to the sense electrodes instead of AC varying biases.

The force rebalance electrode size should be scaled in size based on the upper range of vibration to be sensed by the sense electrodes 100 and the resulting voltages supplied to the electrodes 204 and 208 of the rebalance electrodes 200 by the electronics described herein. Using charge pump electronics in CMOS the rebalance voltages may exceed 30 v.

This concludes the description including preferred embodiments of the present invention. The foregoing description including preferred embodiments of the invention has been presented for the purposes of illustration and description. It is not intended to be exhaustive or to limit the invention to the precise forms disclosed. Many modifications and variations are possible within the scope of the foregoing teachings. Additional variations of the present invention may be devised without departing from the inventive concept as set forth in the following claims.

What is claimed is:

1. In combination, a shear-mode quartz resonator designed to mechanically oscillate at a predetermined frequency and electronic circuits for inhibiting oscillation of the shear-mode quartz resonator in response to externally applied mechanical forces, the mechanical forces otherwise inducing mechanical vibration of the shear-mode quartz resonator at frequencies significantly less than said predetermined frequency, the shear-mode quartz resonator comprising:
   a. a quartz beam which is attached to a substrate layer at or near one end of said quartz beam;
   b. said quartz beam having relatively large metallic electrodes attached on opposite sides thereof, the relatively large metallic electrodes, in use, being coupled to an external oscillator circuit;
   c. said quartz beam having relatively smaller sense and rebalance electrodes attached on the same opposite sides of said quartz beam as said relatively large metallic electrodes;
   d. the relatively smaller sense and rebalance electrodes being coupled, in use, with said electronic circuits for inhibiting oscillation of the shear-mode quartz resonator in response to externally applied mechanical forces, the mechanical forces otherwise inducing mechanical vibration of the shear-mode quartz resonator at frequencies significantly less than said predetermined frequency.

2. The combination of claim 1 wherein the sense and rebalance electrodes on each opposing side of said quartz beam surround or at least nearly surround the relatively large metallic electrode disposed on the same side of said beam as the sense and rebalance electrodes which surround or at least nearly surround said relatively large metallic electrode.

3. The combination of claim 2 wherein said relatively large metallic electrode has a geometric shape and wherein said sense and rebalance electrodes also have geometric shapes, an exterior of the geometric shape of the relatively large metallic electrode being substantially equally spaced from an interior of the geometric shape of at least one of said sense and rebalance electrodes.

4. The combination of claim 3 wherein said rebalance electrode has a geometric shape and wherein said sense electrode also has geometric shape, an exterior of the geometric shape of the rebalance electrode being substantially equally spaced from an interior of the geometric shape of said sense electrode.

5. The combination of claim 2 wherein said sense electrode has a greater surface area than does rebalance electrode.

6. The combination of claim 5 wherein said sense electrode includes at least two portions, a first portion having a relatively smaller surface area and a second portion having a relatively smaller surface area, the first portion surrounding or at least nearly surrounding the relatively large metallic electrode disposed on the same side of said beam as the sense and rebalance electrodes and wherein the second portion of the sense electrode being disposed on said beam in a location which is remote from said one end of said quartz beam compared to where the relatively large metallic electrode is disposed on said beam.

7. The combination of claim 1 wherein said sense electrode has a greater surface area than does rebalance electrode.

8. The combination of claim 7 wherein said sense electrode includes at least two portions, a first portion having a relatively smaller surface area and a second portion having a relatively smaller surface area, the first portion surrounding or at least nearly surrounding the relatively large metallic electrode disposed on the same side of said beam as the sense and rebalance electrodes and wherein the second portion of the sense electrode being disposed on said beam in a location which is remote from said one end of said quartz beam compared to where the relatively large metallic electrode is disposed on said beam.

9. The combination of claim 1 wherein said electronic circuits include (i) sense electronics coupled in use to the sense electrodes of the shear-mode quartz resonator and (ii) rebalance electronics coupled to the sense electronics and to the rebalance electrodes of the resonator.

10. The combination of claim 1 wherein sense and rebalance electrodes are also disposed on structural members supporting and at least partially surrounding said beam, the opposing sense and rebalance electrodes being disposed in a confronting relationships with corresponding sense and rebalance electrodes on said beam.

11. The combination of claim 1 wherein said beam is a quartz beam and hays a thickness equal to or less than 10 μm and wherein gaps between confronting sense and rebalance electrodes is no greater than 10 μm.

12. The combination of claim 11 wherein said gaps fall in the range of 2 to 10 μm.

13. A resonator designed to mechanically oscillate at a predetermined frequency and for use with electronic circuits for inhibiting oscillation of the resonator in response to externally applied mechanical forces, the mechanical forces capable of otherwise inducing a mechanical vibration of the resonator at a frequency or frequencies significantly less than said predetermined frequency, the shear-mode quartz resonator comprising:
 a. a beam of a dielectric material, said beam being attached to a substrate layer at or near at least one end of said beam;
 b. said beam having relatively large metallic electrodes attached on opposite sides thereof, the relatively large metallic electrodes, in use, being coupled to an external oscillator circuit;
 c. said quartz beam having relatively smaller sense and rebalance electrodes attached on the same opposite sides of said beam as said relatively large metallic electrodes;
 d. the relatively smaller sense and rebalance electrodes being coupled, in use, with said electronic circuits for inhibiting oscillation of the resonator in response to externally applied mechanical forces, the mechanical forces otherwise being capable of inducing mechanical vibration of the resonator at a frequency or frequencies significantly less than said predetermined frequency.

14. The resonator of claim 13 wherein the sense and rebalance electrodes on each opposing side of said beam surround or at least nearly surround the relatively large metallic electrode disposed on the said side of said beam as the sense and rebalance electrodes which surround or at least nearly surround said relatively large metallic electrode.

15. The resonator of claim 14 wherein said relatively large metallic electrode has a geometric shape and wherein said sense and rebalance electrodes also have geometric shapes, an exterior of the geometric shape of the relatively large metallic electrode being substantially equally spaced from an interior of the geometric shape of at least one of said sense and rebalance electrodes.

16. The resonator of claim 15 wherein said rebalance electrode has a geometric shape and wherein said sense electrode also has geometric shape, an exterior of the geometric shape of the rebalance electrode being substantially equally spaced from an interior of the geometric shape of said sense electrode.

17. The resonator of claim 16 wherein said sense electrode has a greater surface area than does rebalance electrode.

18. The resonator of claim 17 wherein said sense electrode includes at least two portions, a first portion having a relatively smaller surface area and a second portion having a relatively smaller surface area, the first portion surrounding or at least nearly surrounding the relatively large metallic electrode disposed on the same side of said beam as the sense and rebalance electrodes and wherein the second portion of the sense electrode being disposed on said beam in a location which is remote from said at least one end of said quartz beam compared to where the relatively large metallic electrode is disposed on said beam.

19. The resonator of claim 13 wherein said sense electrode has a greater surface area than does rebalance electrode.

20. The resonator of claim 19 wherein said sense electrode includes at least two portions, a first portion having a relatively smaller surface area and a second portion having a relatively smaller surface area, the first portion surrounding or at least nearly surrounding the relatively large metallic electrode disposed on the same side of said beam as the sense and rebalance electrodes and wherein the second portion of the sense electrode being disposed on said beam in a location which is remote from said one end of said quartz beam compared to where the relatively large metallic electrode is disposed on said beam.

21. A method of dynamically damping a quartz resonator comprising the steps of:
 a. disposing sense and rebalance electrodes on opposite side of a quartz beam of said quartz resonator;
 b. disposing opposing sense and rebalance electrodes on structural members supporting and at least partially surrounding said quartz beam, opposing sense and rebalance electrodes being disposed in a confronting relationships with corresponding sense and rebalance electrodes on said quartz beam;

c. using a first electronic circuit coupled to said sense electrodes on said quartz beam and on said structural members to sense movement of said beam in response to an externally applied shock; and d. using a second electronic circuit couple to said first electronic circuit and to said rebalances electrodes on said quartz beam and on said structural members to apply a counter-acting electrostatic force to said quartz beam to counter-act significant movement of said quartz beam in response to said externally applied shock.

22. The method of claim 21 wherein the sense and rebalance electrodes disposed on each opposing side of said quartz beam surround or at least nearly surround a relatively large metallic electrode disposed on a common sides of said beam with the sense and rebalance electrodes.

23. The method of claim 21 wherein the opposing sense and rebalance electrodes are disposed in said confronting relationships with corresponding sense and rebalance electrodes on said quartz beam with gaps there between being in the range of approximately 2 to 10 μm.

* * * * *